(12) United States Patent
Gu et al.

(10) Patent No.: US 11,966,079 B2
(45) Date of Patent: Apr. 23, 2024

(54) SPLICED OPTICAL FIBER WITH SPLICE PROTECTION, CURRENT SENSOR WITH SUCH SPLICED OPTICAL FIBER AND METHOD FOR PROTECTING A SPLICED OPTICAL FIBER

(71) Applicant: HITACHI ENERGY LTD, Zürich (CH)

(72) Inventors: Xun Gu, Neuenhof (CH); Philippe Gabus, Nyon (CH)

(73) Assignee: HITACHI ENERGY LTD, Zurich (CH)

( * ) Notice: Subject to any disclaimer, the term of this patent is extended or adjusted under 35 U.S.C. 154(b) by 744 days.

(21) Appl. No.: 17/041,098

(22) PCT Filed: Apr. 2, 2019

(86) PCT No.: PCT/EP2019/058299
§ 371 (c)(1),
(2) Date: Sep. 24, 2020

(87) PCT Pub. No.: WO2019/197223
PCT Pub. Date: Oct. 17, 2019

(65) Prior Publication Data
US 2021/0116641 A1 Apr. 22, 2021

(30) Foreign Application Priority Data
Apr. 12, 2018 (EP) .................................... 18167061

(51) Int. Cl.
*G02B 6/255* (2006.01)
*G01R 15/24* (2006.01)
*G01R 19/00* (2006.01)
*G02B 6/024* (2006.01)

(52) U.S. Cl.
CPC ............ *G02B 6/2558* (2013.01); *G01R 15/24* (2013.01); *G01R 19/0092* (2013.01); *G02B 6/024* (2013.01)

(58) Field of Classification Search
CPC .. G01R 15/24; G01R 19/0092; G02B 6/2558; G02B 6/024; G02B 6/255
See application file for complete search history.

(56) References Cited

U.S. PATENT DOCUMENTS 4,784,458 A    11/1988   Horowitz et al.
6,643,433 B2 * 11/2003   Gonthier .............. G02B 6/2773
                                                                                     385/11

(Continued)

FOREIGN PATENT DOCUMENTS

EP    0595973       2/1993
EP    1022596 A2   7/2000

(Continued)

OTHER PUBLICATIONS

International Search Report and Written Opinion dated Jun. 19, 2019 for International Application No. PCT/EP2019/058299, 15 pages.

(Continued)

*Primary Examiner* — Dominic E Hawkins
(74) *Attorney, Agent, or Firm* — Sage Patent Group

(57) ABSTRACT

The invention relates to a spliced optical fiber comprising a first and second polarization-maintaining optical fiber connected at ends by splicing; to fiber optic current sensors; and to a method for protecting the spliced optical fiber against mechanical stress and/or humidity. A protection tube is arranged around the spliced optical fiber in a splice section of the spliced optical fiber. A first and second end of the protection tube is sealed to the spliced optical fiber by first and second sealing arrangement for protecting the splice.

20 Claims, 2 Drawing Sheets

(56) References Cited

U.S. PATENT DOCUMENTS

Figure 1:
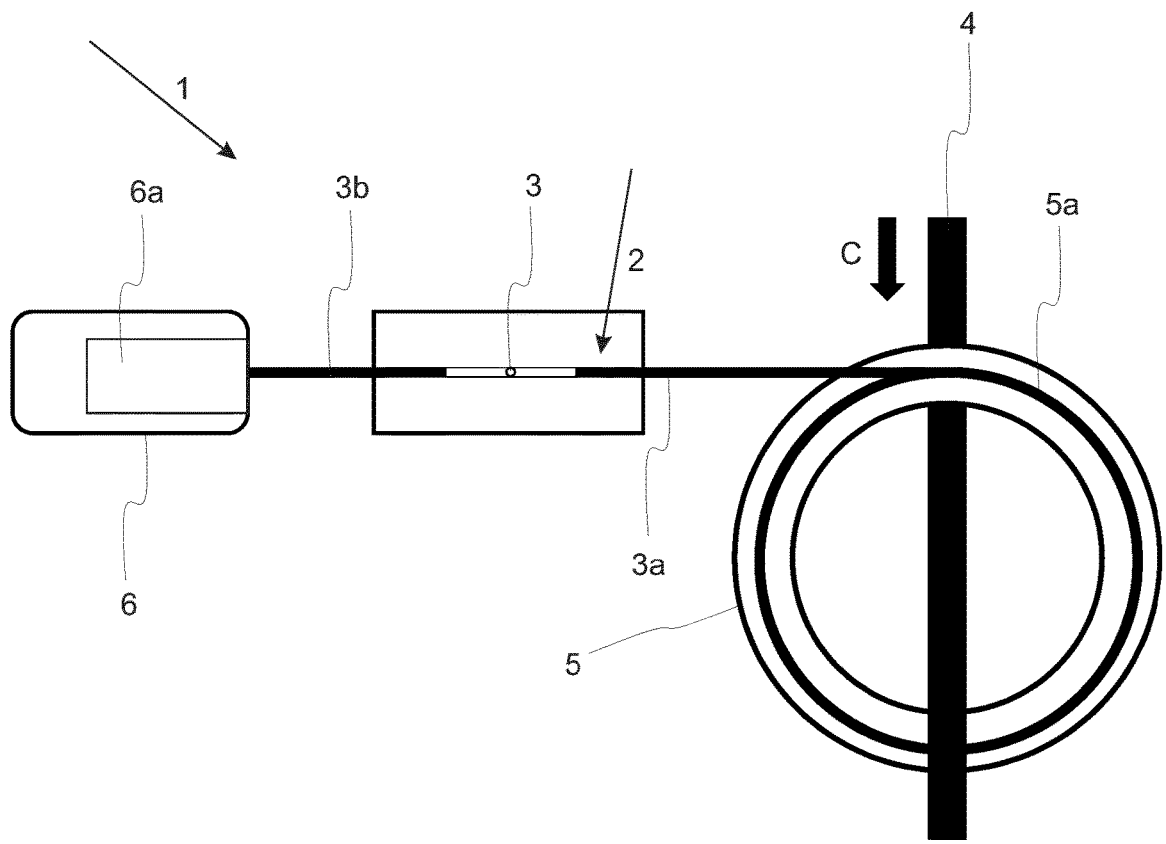

| | | | |
|---|---|---|---|
| 9,377,489 B2* | 6/2016 | Wallace | G01R 35/00 |
| 10,247,761 B2* | 4/2019 | Müller | G01R 15/247 |
| 2004/0114887 A1* | 6/2004 | Chandan | G02B 6/2551 |
| | | | 385/99 |
| 2011/0135247 A1* | 6/2011 | Achara | E21B 47/017 |
| | | | 385/12 |
| 2013/0234698 A1* | 9/2013 | Dorner | G01R 15/246 |
| | | | 324/96 |
| 2016/0377660 A1* | 12/2016 | Müller | G01R 15/246 |
| | | | 324/96 |

FOREIGN PATENT DOCUMENTS

| | | |
|---|---|---|
| EP | 3156808 A1 | 4/2017 |
| WO | 93/02374 | 2/1993 |
| WO | 03/096090 A1 | 11/2003 |

OTHER PUBLICATIONS

K. Bohnert, P. Gabus, J. Nehring, and H. Brändle, "Temperature and Vibration Insensitive Fiber-Optic Current Sensor," Journal of Lightwave Technology, vol. 20, No. 2, Feb. 2002, pp. 267-276 (10 pages).

K. Bohnert, P. Gabus, J. Nehring, H. Brändle, and M. G. Brunzel, "Fiber-Optic Current Sensor for Electrowinning of Metals," Journal of Lightwave Technology, vol. 25, No. 11, Nov. 1997, pp. 3602-3609 (8 pages).

Fujikura, "Fiber Protection Sleeves," No. B12M0071B, Jan. 2015, 2 pages.

E.G. Tec, "Easy Crimp Splice Protection," EG-CSP-250M/P150, Jan. 9, 2018, 2 pages.

3M, "Silane Glass Treatment AP115," Oct. 2006, 2 pages.

* cited by examiner

SPLICED OPTICAL FIBER WITH SPLICE PROTECTION, CURRENT SENSOR WITH SUCH SPLICED OPTICAL FIBER AND METHOD FOR PROTECTING A SPLICED OPTICAL FIBER

CROSS-REFERENCE TO RELATED APPLICATIONS

This application is a 35 U.S.C. § 371 national stage application of PCT International Application No. PCT/EP2019/058299 filed on Apr. 2, 2019, which claims priority to European Patent Application No. 18167061.3 filed on Apr. 12, 2018, the disclosures and content of which are incorporated by reference herein in their entireties.

TECHNICAL FIELD

The invention relates to a spliced optical fiber, a fiber optic current sensor comprising such a spliced optical fiber and a method for protecting a splice of a spliced optical fiber according to the independent claims.

BACKGROUND

Many fiber optic applications require joining optical fibers. For applications involving polarization-maintaining (PM) fibers, the light polarization state can be maintained only when the fiber axes are well aligned at the joint, because the polarization extinction ratio (PER), a figure representing the power ratio of polarization crosstalk, is given by $X=\tan^2 \alpha$, where $\alpha$ is the angular misalignment.

Such an application is a fiber-optic current sensor (FOCS). A FOCS uses light polarization to measure current. A FOCS system employs the Faraday effect, which converts the magnetic field generated around a current-carrying conductor to a phase shift between orthogonal circular polarizations of light propagating inside an optical fiber wound around the connector. The light is generated and detected in an opto-electronics unit (or secondary converter, SC), whereas the passive sensing fiber is contained in a sensor head (or primary converter, PC) placed around the current-carrying conductor. Light is transferred back and forth in a PM fiber cable between the PC and SC.

During FOCS system installation, the PC and SC are separately installed at their respective locations, and the PM fiber cable between them must be joined on site. Because the light polarization state in the PM fiber cable carries the current-induced Faraday phase shift, any distortion to it, e.g. by the fiber joint, would directly lead to a change in the measured current. It can be theoretically found that the FOCS current measurement scale factor S is affected by the PER at a fiber joint according to the following equation:

$$S/S_0=[\cos(2\arctan\sqrt{X})]^{-1}\approx 1+2X \text{ for } X\ll 1$$

where X is the PER at the joint, and $S_0$ is the scale factor without the joint.

While a permanent current measurement scale factor shift (e.g. caused by a joint with a stable PER) can be compensated by proper rescaling of the FOCS system at installation, a joint PER variation during operation cannot be compensated and therefore would increase the current measurement error. Since the joint is typically collocated with the SC in an instrument cabinet, its temperature would be the same as for the SC, typically from −25° C. to 65° C. In order to keep the joint PER stable under all specified conditions, the PM fiber axis misalignment at the joint must remain constant, and the packaging method of the joint must not result in an excessively large PER variation.

For an IEC 0.2-class current transformer, the required current measurement accuracy is ±0.2% at the rated current. The allowable contribution from the PM fiber joint must be much smaller than the allowed maximum accuracy of the entire FOCS system. As an example, a typical system error budget assigns ±0.03% to the fiber joint, which would mean that the joint PER variation must be kept below ±0.015%.

Known methods for joining optical fibers exist. A straightforward method of realizing a PM fiber joint is to use a pair of angularly keyed fiber connectors. However, this approach is extremely challenging for a 0.2-class system (metering accuracy), because, in order to achieve the desired ±0.015% PER limit, the angular misalignment between the PM fiber connectors must remain stable within ±0.7°. Packaging stress on the fiber within the connectors should also be stable at all specified temperatures. Experience shows that a PM fiber joining approach based on connectors, even with sophisticated connector pretesting and pairing, is either too unreliable or too expensive for a FOCS product of metering accuracy.

Another fiber joining approach is to make a splice between the PM fibers. In the splicing process, the PM fiber ends on both sides are first stripped off their coatings and cleaned; subsequently, the fiber ends are cleaved and fused together in a splicing machine. Splicing is a standard procedure for field installation of optical fiber communication devices. The difference from the FOCS application is that, whereas a splice in an optical communication system is typically between single-mode fibers, the splice in a FOCS system is between PM fibers, which requires accurate angular alignment of the fibers, and in turn requires a more complicated and more expensive splicing machine. The relative angular alignment between the PM fibers is fixed after splicing, so that its PER would no longer vary when environmental conditions change.

Two short sections of uncoated bare fiber are present on both sides of the splice location in a spliced optical fiber. The length of the bare fiber section depends on the splicing machine model and its settings and is typically between 4 mm and 25 mm on each side of the splice. They and the splice must be sealed and protected due to multiple reasons: i) the splice location has lower mechanical strength than a normal fiber and breaks easily under stress or tension, because the coatings which improve strength are no longer present; ii) the bare fiber surface contains micro-fissures, which, if exposed to moisture, often grow and lead to premature fiber damage. As mentioned earlier, for the FOCS application, the protection method must also not cause an excessive temperature-dependent PER variation.

Commercial splice protectors on the market are designed primarily for protecting single-mode fiber splices. These protectors are widely used in the optical fiber communication industry, providing good mechanical strength and sealing quality for the splice. Most FOCS manufacturers also use such protectors in a metering-class FOCS system.

The most common design, of which multiple variants exist, consists of a dual-tube shrink sleeve with a strength element between the tubes. The outer tube is a heat shrink tube, whereas the inner tube is made of hot-melt adhesive such as ethylene vinyl acetate (EVA). The strength element is typically a steel rod running along the tube length. The dual tube is slit over the bare fiber section and heated in a splice protector oven (commonly included as an accessory in a splicing machine). Under heat, the inner tube melts while the outer tube radially contracts, forming a solid plastic cylinder surrounding the fiber and the steel strength element after cooling. A properly applied splice protector sleeve is mechanically robust and the fiber is well protected from the environment. Moreover, the implementation is straightforward and requires no special handling of delicate materials.

In case of another splice protector design, the fiber is placed between adhesive-covered sandwich metal plates and the splice protector is simply crimped together with a special hand tool.

A common problem with all aforementioned commercial splice protectors is the stress exerted on the fiber. The entire bare fiber section is tightly surrounded by adhesive and packaging material, which squeezes on the fiber and significantly deteriorates the PER. Furthermore, because the thermal expansion coefficients of plastic ($180 \times 10^{-6}$ K$^{-1}$ for EVA), stainless steel ($\sim 10 \times 10^{-6}$ K$^{-1}$) and fused silica of the fiber ($0.59 \times 10^{-6}$ K$^{-1}$) are so vastly different, large variation in stress and PER arise as the temperature changes. In tests, no commercial splice protectors deliver a reliably low PER variation in the specified temperature range for a metering-class FOCS system.

Another common method of protecting a fiber splice is to recoat the bare fiber section with a material to a diameter similar to the original coating diameter. The typical recoat material is a UV-cured acrylate, which provides adhesive and mechanical properties similar to the original fiber coating. The disadvantages of this method, aside from requiring an expensive UV fiber recoating machine and a high-quality splicing machine to ensure a high-strength splice, include the sensitive storage and application conditions and relatively short shelf life of the recoat material.

U.S. Pat. No. 4,784,458 A1 discloses a spliced joint between single mode polarization maintaining fibers.

WO 03/096090 A1 discloses a production method for polarization-preserving optical fiber couplers.

DESCRIPTION OF THE INVENTION

It is therefore an objective of the present invention to improve splice protection in spliced optical fibers with respect to said disadvantages, particularly in view of utilizing spliced optical fibers in applications requiring metering accuracy.

This objective is solved by the present invention set out in the independent claims.

A first aspect of the invention involves a spliced optical fiber comprising a first and a second polarization-maintaining optical fiber connected to one another at one of their ends by a splice or by splicing, thereby forming a splice at their connection point. A protection tube is arranged around the spliced optical fiber and surrounds at least an uncoated section of the spliced optical fiber which includes the splice. A first end and a second end of the protection tube are sealed to the spliced optical fiber by a first and a second sealing arrangement for protecting the splice against mechanical stress and/or moisture. Herein, the protection tube may have such a length that an uncoated section of the spliced optical fiber comprising the splice and a coated section of the spliced optical fiber at each end of the uncoated section are arranged inside the protection tube. In embodiments, the protection tube may have a length or a total length such that a first distance from the first end of the protection tube and/or from the first sealing arrangement to a position of the splice and a second distance from the position of the splice to the second end of the protection tube and/or to the second sealing arrangement are greater than or equal to a predefined minimum distance $L_m$. Said minimum distance $L_m$ is chosen to satisfy the following equation:

$$4\sqrt{X_0 X_s} A(L_m) = X_m$$

wherein $X_0$ is a maximum guaranteed polarization extinction ratio of the splice, in particular $X_0$ is a maximum polarization extinction ratio of the splice guaranteed by the splicing or by an utilized splicing procedure, $X_s$ is a maximum guaranteed polarization extinction ratio, in particular of the light inside the spliced optical fiber, at the sealed ends of the protection tube, at the respective end of the protection tube, and/or or at the first and the second end of the protection tube, in particular $X_s$ is a maximum polarization extinction ratio of the spliced optical fiber at the first and/or the second sealing arrangement guaranteed by an utilized sealing procedure, A(L) is a coherence function of a length of the polarization-maintaining fiber and, in particular a Fourier transform of an optical power spectrum, e.g., of a light source connected or to be connected to the spliced optical fiber, and $X_m$ is a predetermined maximum allowable polarization extinction ratio variation, in particular wherein $X_m \leq 0.02\%$ or $0.1\%$, in particular over a temperature range of $-40°$ C. to $85°$ C. or $-20°$ C. to $55°$ C., further in particular wherein $X_0 \leq -30$ dB or $-25$ dB and/or wherein $X_s \leq -30$ dB or $-40$ dB, in particular over a temperature range of $-40°$ C. to $85°$ C. or $-20°$ C. to $55°$ C.

The spliced optical fiber according to the first aspect of the invention may be obtainable by a method comprising
connecting a first and a second polarization-maintaining optical fiber at one of their ends by a splice, utilizing a splicing procedure that guarantees a maximum polarization extinction ratio of the splice of $X_0$;
arranging a protection tube around the spliced optical fiber such that the protection tune surrounds at least an uncoated section of the spliced optical fiber which includes the splice, in particular, wherein the protection tube has such a length that an uncoated section of the spliced optical fiber comprising the splice and a coated section of the spliced optical fiber at each end of the uncoated section are arranged inside the protection tube;
sealing a first and a second end of the protection tube to the spliced optical fiber by a first and a second sealing arrangement, utilizing a sealing procedure that guarantees a maximum polarization extinction ratio of the spliced optical fiber at the first and/or the second sealing arrangement of $X_s$;
wherein a or the length of the protection tube is such that a first distance from the first end of the protection tube and/or from the first sealing arrangement to a position of the splice and a second distance from the position of the splice to the second end of the protection tube and/or to the second sealing arrangement are greater than or equal to a predefined minimum distance $L_m$, wherein the minimum distance $L_m$ is chosen to satisfy the following equation:

$$4\sqrt{X_0 X_s} A(L_m) = X_m$$

wherein A(L) is a coherence function of a length of the polarization-maintaining fiber and a Fourier transform of an optical power spectrum, in particular of a light source connected or to be connected to the spliced optical fiber, and $X_m$ is a predetermined maximum allowable polarization extinction ratio variation, in particular wherein, in particular wherein $X_m \leq 0.02\%$ or $0.1\%$, in particular over a temperature range of $-40°$ C. to $85°$ C. or $-20°$ C. to $55°$ C., further in particular wherein $X_0 \leq -30$ dB or $-25$ dB and/or wherein $X_s \leq -30$ dB or $-40$ dB, in particular over a temperature range of $-40°$ C. to $85°$ C. or $-20°$ C. to $55°$ C.

An advantage of the spliced optical fiber according to the first aspect of the invention is that it provides protection of the splice of the spliced optical fiber against mechanical stress and/or humidity by sealing it inside a protection tube. The sealing of the protection tube to the spliced optical fiber only at its ends reduces stress on the spliced optical fiber, particularly on its splice section which is uncoated as a result of the splicing process and consequently more sensitive to mechanical stress. In this way, the uncoated section around the splice need not be recoated for being protected, thereby simplifying the protection process. Furthermore, by dimensioning the length of the protection tube in accordance with the above equation, the temperature-dependent PER variation is further reduced to such extent that the spliced optical fiber can be used for metering accuracy applications. This is related to potential interference between the splice and sealing points, and will become more apparent when considering the description in connection with FIG. 2.

In a particularly preferred embodiment, the length of the protection tube is chosen such that an uncoated section of the spliced optical fiber, which comprises the splice, and a coated section of the spliced optical fiber at each end of the uncoated section are arranged inside the protection tube, in particular such that the space extending transversally to the spliced optical fiber between the uncoated section of the fiber and the protective tube is filled by air or another gas and/or such that the uncoated section of the spliced optical fiber is devoid of any parts of the first and/or the second sealing arrangement and/or of an adhesive. This measure advantageously makes it possible to apply the sealing arrangement only on sections of the optical fiber which are protected by a coating, thereby reducing the mechanical stress on the uncoated section to a minimum.

In a preferred embodiment, the protection tube is made of a material having a thermal expansion coefficient which is substantially equal to a thermal expansion coefficient of the spliced optical fiber, preferably fused silica or quartz. As the protection tube and the spliced optical fiber are both exposed to temperature variation at the installation site, this measure ensures that the protection tube and the spliced optical fiber have a substantially equal behavior in view of temperature-dependent dilatation or contraction, thereby minimizing temperature-dependent variation in stress and stress-related PER in the fiber.

In embodiments, at least one of the first and the second sealing arrangements comprise(s) an outer dual-shrink sleeve adapted to shrink radially upon exposure to heat, thereby sealing the protection tube containing the section of the spliced optical fiber which includes the splice against humidity.

Preferably, the outer dual-shrink sleeves of the first and the second sealing arrangements each comprise an outer tube and an inner tube. The first end and the second end of the protection tube are arranged between the inner tube and the outer tube of the respective first and second outer dual-shrink sleeves. This measure additionally increases stability of the protection tube, such that it stays at the intended location without the ability to shift in longitudinal direction of the spliced optical fiber.

In a preferred embodiment, at least one of the first and the second sealing arrangements comprises a capillary sleeve arranged partially inside the protection tube around a section of the spliced optical fiber. The capillary sleeve is sealed to the spliced optical fiber by an inner dual-shrink sleeve at a first end facing the splice and is sealed by the inner tube of respective outer dual-shrink sleeve at a second end.

Preferably, said first end of the capillary sleeve is arranged between an inner tube and an outer tube of the respective inner dual-shrink sleeve, particularly wherein the capillary sleeve is chosen to be longer than the inner tube of the second outer dual-shrink sleeve in longitudinal direction.

Preferably, the inner and the outer dual-shrink sleeves each comprise an inner tube and an outer tube. The outer tubes are made of a material able to radially shrink upon application of heat and the inner tubes are made of an adhesive material able to melt upon application of heat. In embodiments, the materials of the inner tubes and outer tubes of all dual-shrink sleeves have such properties that during a heat-up process by application of heat with a predefined temperature the inner tubes melt before the outer tubes begin to shrink. This optional measure is advantageous because the usage of an adhesive material for the inner tube further increases stability of the optical fiber inside the protection tube. After the adhesive has entirely cooled down, it contributes to a tight sealing with evenly distributed stress on the optical fiber and acts as additional support for the optical fiber.

Advantageously, no reinforcing element, particularly no metal rod running parallel to the spliced optical fiber, is required as additional support element for increasing the mechanical strength of the spliced optical fiber.

A second aspect of the invention relates to a fiber optic current sensor for measuring a current in a current-carrying conductor. The fiber optic current sensor (FOCS) comprises a spliced optical fiber according to the first aspect of the invention. It further comprises a primary converter suitable to be arranged around the conductor. The primary converter is connected to the first polarization-maintaining optical fiber of the spliced optical fiber. Furthermore, a secondary converter is provided, comprising an opto-electronics unit and connected to the second polarization-maintaining optical fiber of the spliced optical fiber for generating light into the same and detecting light from it.

In embodiments, at least one of the first and the second sealing arrangements comprise an adhesive injected into the first and the second end of the protection tube.

A FOCS according to the invention has the aforementioned advantages and additionally the important advantage that it is able to provide extremely precise current measurements in the 0.2-class system by avoiding the significant PER variation with respect to temperature exhibited by comparable known FOCS.

A third aspect of the invention involves a method for protecting a splice of a spliced optical fiber, in particular of the first aspect of the invention, formed by connecting two polarization-maintaining optical fibers against mechanical stress and/or moisture. The method comprises the following steps:

In a step a) the spliced optical fiber is positioned into a protection tube. The protection tube has such a length that the splice is located inside it at the predefined minimum distance from a first end and a second end of the protection tube.

Thereafter, in a first alternative, a step b) follows, consisting of sealing the first end of the protection tube around the spliced optical fiber by applying heat to a first outer dual-shrink sleeve arranged around a portion of the first end of the protection tube and a portion of the spliced optical fiber, thereby shrinking the first outer dual-shrink sleeve onto said portions. Subsequently, in a step c), a capillary sleeve (13) is sealed around a portion of the spliced optical fiber in an area of the second end of the protection tube. The capillary sleeve is positioned at least partially inside the protection tube by applying heat to an inner dual-shrink sleeve arranged around a portion of that end of the capillary sleeve, which is nearest to the splice, and around a portion of the spliced optical fiber. Finally, in a step d), the second end of the protection tube is sealed around the spliced optical fiber by applying heat to a second outer dual-shrink sleeve arranged around a portion of a second end of the protection tube and a portion of the spliced optical fiber, thereby shrinking the second outer dual-shrink sleeve onto said portions.

In a second alternative, the aforementioned sealing steps c) and d) are applied at both the first and the second end of the protection tube. In other words, in the second alternative the step b) of the first alternative is replaced by steps c) and d), applied to the first end of the protection tube as well.

In a third alternative, an adhesive material is injected into the protection tube at both the first and the second end of the protection tube.

An advantage of the method according to the third aspect of the invention is that it offers a simple protection of its splice. As mentioned above, the splicing process requires a mandatory uncoating of a section of the optical fibers to be joined, thereby inevitably reducing the mechanical strength of the spliced optical fiber along that portion. The simplicity of the spliced optical fiber is in the fact that no complex recoating of said section is necessary. Thus, no expensive UV recoating devices are required, thereby also installation costs being reduced.

A further advantage of the method becomes apparent when considering the known alternative of recoating the bare section of the optical fiber; in this method, a direct pressure is exerted onto the uncoated section of the spliced optical fiber, which leads to an increased PER. Since the increased PER is located immediately close to the splice location, the associated temperature-dependent PER variation is not acceptable for metering applications because of the interference effect considered in the description in connection with FIG. 2. Such PER variation can only be reduced by guaranteeing a very low PER splice using an expensive premium-quality splicing machine. In addition, the delicate application and storage conditions of the recoat material and the need for an expensive fiber recoating machine further limit the applicability of the recoating method. In the present invention, as the two protection-related stress points are located at a distance of at least $L_m$ from the splice, the distance is sufficient to keep the interference-related PER variation smaller than the metering application allowance. Furthermore, only a mid-range-quality splicing machine and splice oven are required for the application.

Figure 4:
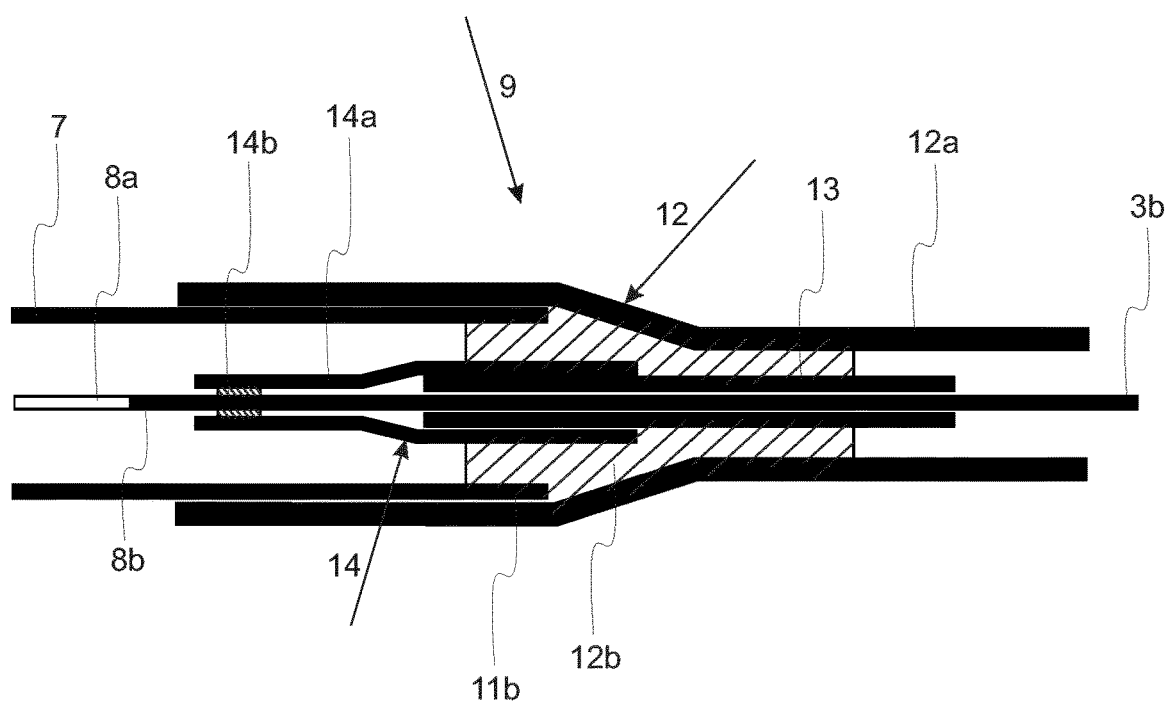

Yet another advantage of the method, which relates to the usage of the capillary sleeve in step c) of the method, is that during cooling of the sealing at the second end (and the first end in the aforementioned second alternative), the second outer dual-shrink sleeve, which acts directly onto the portion at the far end, with respect to the splice, of the capillary sleeve, tends to shift the sealed optical fiber inside the capillary sleeve to the right (as referring to FIG. 4). At the same time, the inner dual-shrink sleeve, which acts directly onto the portion at the end close to the splice of the capillary sleeve, tends to shift the sealed optical fiber inside the capillary sleeve to the left (as referring to FIG. 4). The two effects cancel one another, thus leaving the sealed optical fiber at about the same location relative to the protection tube after the sealing cools. This minimizes the relative movement between the fiber and the protection tube after the sealing, thereby minimizing stress on the fiber.

In a preferred embodiment of the method, the step of sealing the second end of the protection tube around the spliced optical fiber is carried out after a predefined time interval upon completion of the sealing of the first end of the protection tube around the spliced optical fiber. Preferably, the predefined time interval equals at least a minimum cooling time of the respective outer dual-shrink sleeve or adhesive at the first end of the protection tube. This advantageously reduces mechanical stress on the portion of the fiber arranged inside the protection tube, because the longitudinal contraction of the sleeves or adhesive used for sealing the first end during the cooling process will have ended before the sealing of the second end. In other words, due to the freedom of displacement of the spliced optical fiber through the still not sealed second end, the fiber can freely shift until the cooling process of the sealing of the first end of the protection tube has finished. Hence, the waiting time after the sealing the first end eliminates any negative influence of fiber shifting during the sealing of the first end.

It is preferred that a preparation step a') is carried out before the method step a). The preparation step a') consists of attaching the first outer dual-shrink sleeve to the first end of the protection tube and the second outer dual-shrink sleeve to the second end of the protection tube by pre-heating the respective outer dual-shrink sleeve such that its free end remains open. This simplifies on-site installation of a spliced optical fiber according to the invention, as such a pre-fabricated protection element consisting of the protection tube with the outer sleeves can simply be inserted onto the spliced optical fiber to be protected and sealed on the same.

Advantageously, the spliced optical fiber according to the second aspect of the invention is used in an optical measurement device, as mentioned for but not limited to a FOCS, or an optical fiber communication device.

Advantageously, the fiber optic current sensor according to the third aspect of the invention is used for measuring AC or DC currents, particularly DC currents up to 600 kA, particularly in a circuit breaker or in a substation or in an aluminium production installation.

SHORT DESCRIPTION OF THE DRAWINGS

Figure 2:
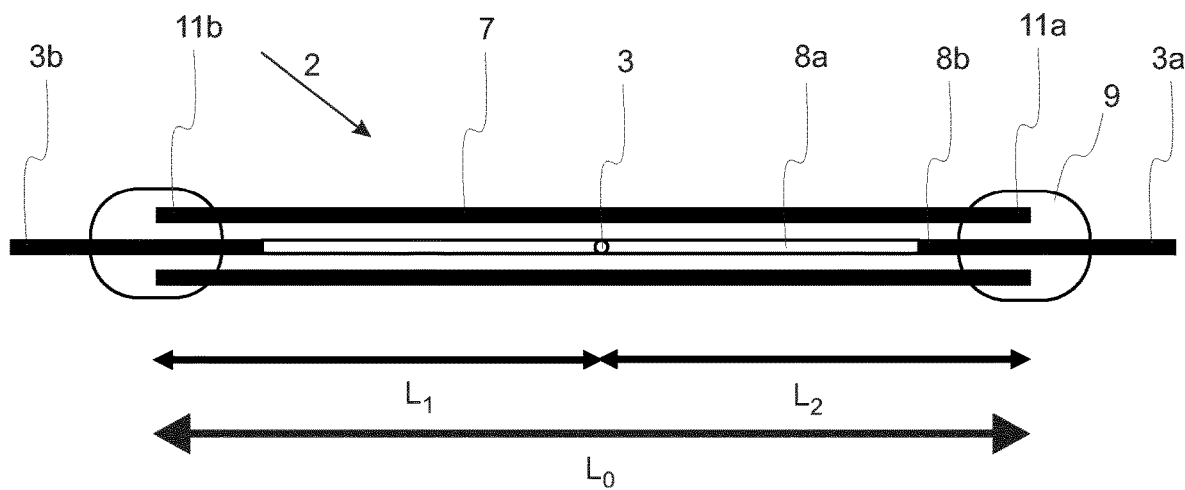
Figure 3:
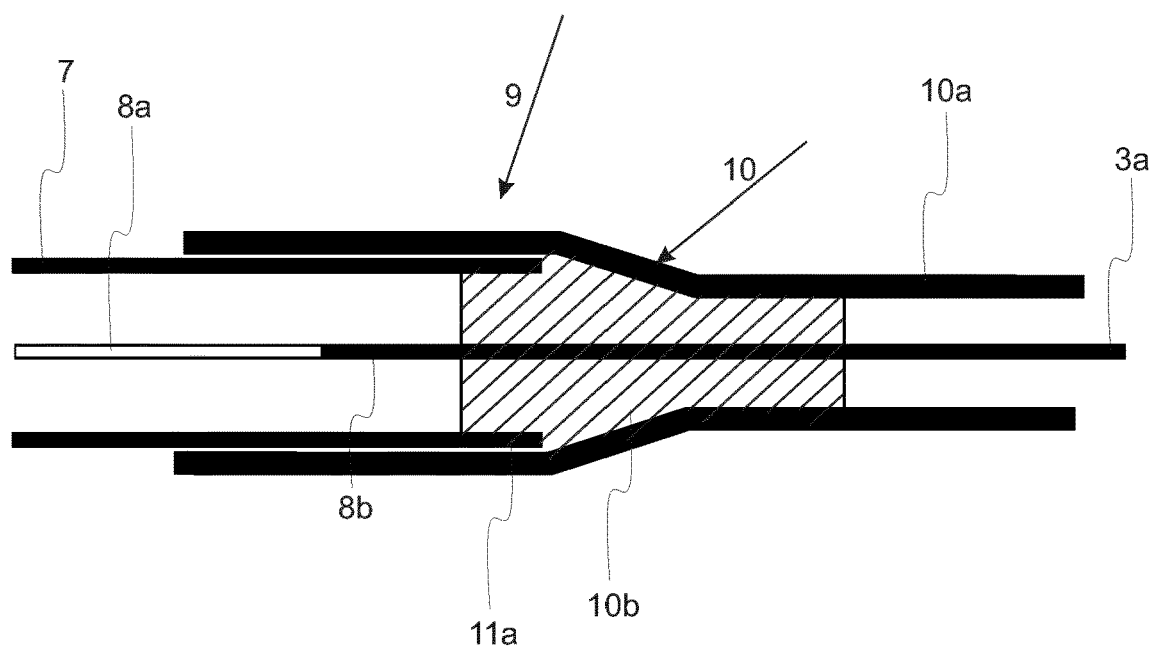

Embodiments, further advantages and applications of the invention result from the dependent claims, claim combinations and from the now following description in conjunction with the figures. It is shown in:

FIG. 1 a schematized view of a fiber optic current sensor according to the invention in an arrangement for measuring a current carried by a current conductor;

FIG. 2 a schematized sectional view of a spliced optical fiber with a protection according to the invention;

FIGS. 3 and 4 schematized sectional views of sealing alternatives for splice protection in a spliced optical fiber according to the invention.

In the drawings same references denote same or similarly acting components.

WAYS OF CARRYING OUT THE INVENTION

The term "spliced optical fiber" refers to an optical fiber obtained by joining two optical fibers using a splicing method. For simplicity reasons, the spliced optical fiber is regarded as a general term and may therefore include the protection according to the invention but may also refer only to the fact that splicing has already been carried out, depending on the context. Particularly, this term shall also underline that for the purpose of the present invention it is irrelevant, whether the splice section of the spliced optical fiber has been treated in any way before applying the splice protection according to the invention.

The term "polarization extinction ratio", PER, refers to the common definition as the ratio of a light intensity in an unwanted polarization state in a polarization-maintaining fiber to a light intensity in an wanted polarization state in the polarization-maintaining fiber; i.e., the smaller the polarization extinction ratio, the better the wanted polarization state is conserved in the polarization-maintaining fiber, e.g., including imperfections such as a splice. A polarization extinction ratio variation is defined as an absolute change of the polarization extinction ratio within specified environmental conditions such as a temperature range.

FIG. 1 shows a schematized view of a fiber optic current sensor 1 according to the invention in an arrangement for measuring a current C carried by a current conductor 4. A spliced optical fiber with a protection according to the present invention has the reference 2 and is formed by a first and a second polarization-maintaining optical fiber 3a, 3b which are joined together at one end by a splicing process. A splice 3 forms the joint of the two fibers 3a, 3b. On the right side of the figure, the first optical fiber 3a is connected at the other end to a primary converter (PC) 5 and the second optical fiber 3b is connected at its other end to a secondary converter (SC) 6. The secondary converter 6 comprises an opto-electronics unit 6a which optically drives the spliced optical fiber 2, i.e., which sends light for propagation into the spliced optical fiber 2 and receives light from the same. It is understood that the secondary converter 6 also comprises all other necessary equipment for signal processing and signal analysis, and is connected to or comprises a user interface, which is known.

The primary converter 5 comprises an optical fiber 5a, which is connected to a part of the first polarization-maintaining optical fiber 3a, and which is arranged around the current conductor 4. The measurement is based on the known principles explained at the beginning and is therefore not explained in more detail here.

FIG. 2 shows a schematized sectional view of a spliced optical fiber 2 with a protection according to the invention. A protection tube 7 is arranged around the spliced optical fiber 2, which is attached to the latter by sealing arrangements 9 at each of its ends, here the first end 11a and the second end 11b. In this figure, the sealing arrangements 9 are meant in an illustrative way and are placeholders for specific embodiments explained in connection with FIGS. 3 and 4.

On the one hand, the protection tube diameter is chosen to be large enough to allow moderate fiber bending without the bent optical fiber pressing hardly onto the inner wall in case of a small length difference between the spliced optical fiber 2 and the protection tube 7. On the other hand, the protection tube diameter is chosen to be small enough such that the spliced optical fiber 2 can easily be kept centralized during sealing. A preferred protection tube diameter is between 1 mm and 25 mm, more preferred between 1 mm and 5 mm.

In embodiments, one of the first and the second PM optical fiber 3a, 3b is inserted into the protection tube 7 prior to splicing, such that the protection tube 7 may be shifted freely along the respective PM optical fiber. After splicing, the protection tube 7 is shifted to its designated location where it encloses the splice 3 and the uncoated sections 8a of the spliced optical fiber 2. Alternatively, it is also conceivable to use a protection tube 7 which can be clamped onto the already spliced optical fiber 2, provided the protection tube 7 is made of a material which is suitable for clamping and at the same time satisfies other requirements like a thermal expansion coefficient which is similar to that of the spliced optical fiber 2. In applications where the PM optical fibers 3a, 3b are spliced before connecting them to the primary and secondary converter 5, 6, respectively, the protection tube 7 is inserted onto one of the ends of the spliced optical fiber 2 before connecting this end to the assigned converter 5 or 6.

Another optional step which may be carried out before sealing the protection tube 7 around the spliced optical fiber 2 is to apply a hydrophobic substance (e.g. silane solution 3M AP115) on the uncoated section 8a of the spliced optical fiber 2. Such treatment is used to prevent moisture attack on glass.

As can be seen in the figure, the sealing is preferably applied, as mentioned, only on coated portions 8b of the spliced optical fiber 2.

The splice 3 is located inside the protection tube 7 at a distance $L_1$ and $L_2$ from the respective end 11b, 11a of the protection tube 7, with the total length being $L_0$. In the exemplary embodiment of FIG. 2, these distances $L_1$ and $L_2$ are preferably equal, however they may be non-equal as long as the shortest distance of them is not smaller than a minimum length $L_m$, the determination of which will be derived in detail in the following.

According to the first aspect of the invention, the length $L_0$ of the protection tube 7 and the distances $L_1$, $L_2$ of the splice 3 to each end 11a, 11b of the protection tube 7 are chosen to satisfy the following equation:

$$4\sqrt{X_0 X_s} A(L_m) = X_m$$

wherein $X_0$ is a maximum guaranteed polarization extinction ratio of the splice 3, $X_s$ is a maximum guaranteed polarization extinction ratio at the respective end 11a, 11b of the protection tube 7, A(L) is a coherence function of a length of the polarization-maintaining fiber 3a, 3b, and $X_m$ is a predetermined maximum allowable polarization extinction ratio variation.

With a splice protected by the protection tube 7 described herein, polarization crosstalk mentioned at the beginning occurs at three distinctive locations. The first location is the splice 3 itself, where polarization crosstalk occurs due to misalignment of the axes of the PM optical fibers 3a, 3b during the splicing process. The maximum warrantable PER depends on the used splicing equipment. With a mid-range-quality splicing machine, a value up to −30 dB is common without special care, and a value of better than −35 dB is often difficult to guarantee even with care. The PER of the splice itself is stable at all temperatures.

Polarization crosstalk also occurs in the spliced fiber 3, or the first and second first polarization-maintaining fiber 3a, 3b, at both ends 11a, 11b of the splice protection tube 7, wherein sealing material exerts stress on the coated section 8b of the spliced optical fiber 2. Stress and PER usually increase at low temperatures, as adhesive and coating harden. For dual shrink sleeves (described in connection with FIGS. 3 and 4) applied on a commercial PANDA fiber, experiments have shown that a PER of maximum −50 dB can be expected in the temperature range from −25° C. to 80° C., with even higher PERs at lower temperatures. Tests with common adhesives applied onto a commercial PANDA fiber have shown similar values.

A maximum PER of −50 dB (of light inside the spliced optical fiber 2) at the sealed ends 11a, 11b of the protection tube 7 (corresponding to maximum 0.002% in scale factor increase of a corresponding current sensor) may seem harmless at first glance; however, when considering the PER of the protected spliced optical fiber 2, one must consider the fiber and the protection assembly as a whole, which particularly means that any interference effects between the individual PER locations must also be taken into account.

Assuming that the splice 3 has a PER of $X_0$, and the at the sealing ends 11a, 11b there is a PER of $X_1$ and $X_2$, respectively, with the distance being $L_1$ between the sealing end 11b with $X_1$ and the splice location with $X_0$, and the distance being $L_2$ between the splice location and the sealing end 11a with $X_2$. The overall PER of the sealed splice protector, taking into account interference, is calculated as $$X = X_0 + X_1 + X_2 + 2\sqrt{X_0 X_1} A(L_1) \cos \phi_1 + 2\sqrt{X_0 X_2} A(L_2) \cos \phi_2 + 2\sqrt{X_1 X_2} A(L_1+L_2) \cos(\phi_1+\phi_2)$$

where $\phi_{1,2} = 2\pi L_{1,2}/L_B$ denotes the differential polarization phase shifts in the PM fiber sections between the splice 3 and the sealing ends 11a, 11b, $L_B$ is the PM fiber beat length, and $A(L)$ is the coherence function of PM fiber length L.

Physically, the coherence function $A(L)$ is the Fourier transform of the optical power spectrum; therefore, its width (known as the coherence length) is inversely proportional to the spectral bandwidth. For a Gaussian spectrum with FWHM bandwidth $\Delta\lambda_{1/2}$ centered at wavelength $\lambda_0$, the coherence function is a Gaussian function $$A(L) = \exp[-(L/\Delta L_c)^2/2]$$

with the coherence length being $\Delta L_c = K L_b \lambda_0 / \Delta\lambda_{1/2}$, and $K = \sqrt{2\ln2}/\pi$.

For example, a superluminescent diode source has a FWHM bandwidth $\Delta\lambda_{1/2}$ of 35 nm at 1310 nm. A commercial PANDA PM 1300 fiber has a beat length $L_B$ of 3.6 mm. For this system, the coherence length in the PANDA fiber is $\Delta L_c = 50$ mm, which means that the degree of coherence $A(L)$ drops to $e^{-1/2} = 61\%$ at 50 mm from a polarization crosstalk location in a PANDA fiber.

For simplicity reasons, it is assumed that $L_1 = L_2 = L$, $\phi_1 = \phi_2 = \phi$, and $X_1 = X_2 = X_s$, such that the overall PER can be written as $$X = X_0 + 2X_s + 4\sqrt{X_0 X_s} A(L) \cos \phi + 2X_s A(2L) \cos 2\phi$$

As an example, we take $X_s \leq -50$ dB $= 0.001\%$. Therefore, the temperature variation of $X_s$ and the second interference term $|2X_s A(2L) \cos 2\phi| < 2X_s A(2L) < 2X_s$ have negligible influence on the overall PER. Furthermore, considering that is $X_0$ constant, the only important term that contributes to the temperature variation of the overall PER is $4\sqrt{X_0 X_s} A(L) \cos \phi$. In order to reduce its temperature variation, one must either minimize the variation of phase shift $\phi = 2\pi L/L_B$ in the specified temperature range, or suppress the interference amplitude $4\sqrt{X_0 X_s} A(L)$.

As to the former approach, it is possible to adjust the distance L between the splice location 3 and the sealing ends 11a, 11b. A commercial PANDA PM 1300 fiber has a beat length temperature coefficient $c_b = dL_b/L_b dT$ of around $6.5 \times 10^{-4}$ K$^{-1}$. With the light source and fiber parameters given above and $\Delta T = 90$ K (SC temperature range from $-25°$ C. to $65°$ C.), $\phi(T)$ variation would already reach $\pi$ (corresponding to half an oscillation cycle, or, e.g., full amplitude change between minimum and maximum), if $L = L_b/(2c_b \Delta T) = 31$ mm. Making L a small fraction of that is impractical, because the splicing process requires stripping off the fiber coating, which leaves a bare fiber section 8a on each side with a length up to 25 mm. The sealing material also needs to cover many millimeters of coated fiber to ensure reliable insulation.

As to the latter approach, the only tuneable variable is also L, but in this case the longer the distance L, the smaller the coherence function $A(L)$. Using the error budget given in the background section as an example, to keep the scale factor variation of the protected splice 3 below ±0.03%, the PER variation must be smaller than ±0.015%. That means $4\sqrt{X_0 X_s} A(L) < 0.015\%$. Using the worst-case values $X_0 = -30$ dB and $X_s = -50$ dB, to reach the target, the following applies: $A(L) < A_m = 0.375$. Using the light source and fiber parameters given above, this yields a minimum splice-sealing separation $L_m = \Delta L_c \sqrt{-2\ln A_m} = 71$ mm.

The minimum splice-sealing separation $L_m$ may be reduced, if a lower splice PER can be guaranteed (e.g. with a reliable PER control routine or with a high-quality splicing machine).

The maximum guaranteed polarization extinction ratio of the splice $X_0$ depends on the quality of the splicing machine in use and the operating conditions. With a mid-range splicing machine, a value up to $-30$ dB or $-25$ dB is common without special care, while a value of better than $-35$ dB is often difficult to guarantee even with care. With a high-end machine, a value of $-40$ dB is commonly achievable. The maximum guaranteed polarization extinction ratio of the sealing ends $X_s$ depends on the sealing method or procedure and/or material used as well as on the required temperature range since the material used may contract and/or harden at low temperatures. For some dual shrink sleeves, a value of $-50$ dB may be achieved over a large temperature range; for other sealing materials or procedures, e.g., adhesive injected into the protection tube ends, a value smaller than or equal to $-40$ dB or even $-30$ dB is common. The maximum allowable polarization extinction ratio variation of the entire protected splice section $X_m$ is determined by the required accuracy of the entire fiber-optic current sensor system, the number of splices in the system, and the possible scale factor variation of other components in the system. For example, a 0.2 class current sensor must have an accuracy $<\pm 0.2\%$, which includes the contributions of all components. Depending on the performance of other components, if only one protected splice section is in the system, its maximum allowable polarization extinction ratio variation may be 0.015%. If there are two statistically independent protected splice sections in the same system, the maximum allowable polarization extinction ratio variation of each would be 0.011%. For other applications, $X_m$ maybe smaller or equal to 0.02% or even 0.1%. Typical temperature ranges to which the splice is exposed are a temperature range of $-40°$ C. to $85°$ C. or $-20°$ C. to $55°$ C.

FIGS. 3 and 4 show schematized sectional views of sealing alternatives for splice protection in a spliced optical fiber 2 according to the invention. The sealing arrangement 9 of the two ends of the protection tube 7 shown in both figures reflects the aforementioned first alternative for the method according to the third aspect of the invention, whereas the sealing of FIG. 4 applied at both ends of the protection tube 7 reflects the second alternative for the method according to the third aspect of the invention. The third alternative (sealing with adhesive) is not shown in the figures. It involves injection of the adhesive into the protection tube 7 at both ends 11a, 11b, wherein preferably it is waited until the adhesive at the first end 11a of the protection tube has entirely cooled down before injection of adhesive at the second end 11b of the protection tube 7.

FIG. 3 shows the first end 11a of the protection tube 7 in a sealed state. The first polarization-maintaining optical fiber 3a is shown with a portion 8a which was stripped off its coating for the splicing process and a portion 8b which remained coated. The first outer dual-shrink sleeve 10 is shown in shrunk state, after it has been subjected to heat, and consists of an outer tube 10a and an inner tube 10b. The inner tube 10b has molten during heat application and the outer tube 10a has shrunken around the inner tube 10b and the first end 11a of the protection tube 7, thereby creating a sealing against moisture and/or mechanical stress. Additionally, this type of dual-shrink sleeve improves stability of the PM fiber 3a which has a firm seat after the inner tube 10b has cooled down.

FIG. 4 shows the second end 11b of the protection tube 7 in a sealed state. The second polarization-maintaining optical fiber 3b is shown with a portion 8a which was stripped off its coating for the splicing process and a portion 8b which remained coated. The second outer dual-shrink sleeve 12 is shown in shrunken state, after it has been subjected to heat, and consists of an outer tube 12a and an inner tube 12b. The inner tube 12b has partially molten during heat application and the outer tube 12a has shrunken around the inner tube 12b and the second end 11b of the protection tube 7, thereby creating a sealing against moisture and/or mechanical stress. Additionally, this type of dual-shrink sleeve improves stability of the PM fiber 3b which has a firm seat after the inner tube 12b has cooled down. Beforehand, a capillary sleeve 13 was introduced and fixed inside the second outer dual-shrink sleeve 12, as already described. The inner dual-shrink sleeve 14 seals the splice-facing end of the capillary sleeve 13, which is its left end in the figure, to the second polarization-maintaining optical fiber 3b. Just like in case of the outer dual-shrink sleeve 12, the inner dual-shrink sleeve 14 also has an outer tube 14a and an inner tube 14b, the behavior of which tubes is similar to the one explained for the second outer dual-shrink sleeve 12. Herein, the inner tube melts around a part of the coated section 8b of the PM fiber 3b. It is preferred that the capillary sleeve 13 or capillary sleeves 13 is or are chosen to be longer than the inner tube 12b of the second outer dual-shrink sleeve 12 in longitudinal direction. The capillary sleeve 13 advantageously acts as a reinforcement element for the portion of the PM fiber 3b at the sealing location and also protects it from direct contact of the inner tube 12b with the PM fiber.

Preferably, the sealing steps b) and d) of the method according to the third aspect of the invention are carried out in such a way that said ends 11a, 11b of the protection tube 7 come to lie between an inner tube 10b; 12b and an outer tube 10a; 12a of the respective first and second outer dual-shrink sleeve 10, 12. Similarly, the sealing step c) of the alternative of FIG. 4 is also carried out in such a way that said end of the capillary sleeve 13 comes to lie between an inner tube 14b and an outer tube 14a of the respective inner dual-shrink sleeve 14.

The capillary sleeve 13 also has the advantage mentioned at the beginning, which is explained in more detail in the following. Heat shrink tubes normally first shrink radially under heat, and then shrink further longitudinally when cooling. In the protection tube 7 sealed with dual shrink sleeves 10, 12 at both ends, this behavior means that the PM fibers 3a, 3b at the ends 11a, 11b of the protection tube 7 would be drawn into the protection tube 7 by the dual-shrink sleeve 10, 12 during cooling, causing the spliced optical fiber 2 inside the protection tube 7 to bend or even slightly coil, which potentially increases the stress on the splice. To prevent this problem, in a preferred embodiment, only one end (e.g. the first end 11a) of the protection tube 7 is sealed with a dual shrink sleeve 10 of FIG. 3, whereas the second end 11b of the protection tube 7 is sealed with the two inner and outer dual shrink sleeves 14, 12 and the capillary sleeve 13. The second end 11b of the protection tube 7 is sealed with a larger dual shrink sleeve 12 onto the capillary sleeve 13, which contains the PM fiber 3b. The inner end of the capillary sleeve 13 (left end in the figure) is sealed onto the PM fiber 3b with the smaller inner dual shrink sleeve 14, while the outer (right end in the figure) end is open. In application, the first end 11a of the protection tube 7 is heated and sealed first. Next, after the first end 11a has fully cooled down, the second end 11b of the protection tube 7 is heated. During cooling, both the smaller and larger inner and outer shrink sleeves 14, 12, respectively, shrink in length, with the former bringing the sealed fiber (to the right in the figure) into the capillary sleeve 13 and the latter bringing the capillary sleeve 13 (to the left in the figure) into the protection tube 7. The net effects largely cancel one another, thereby keeping the sealed spliced optical fiber 2 at about the same location relatively to the protection tube 7 after the sealing cools down.

As mentioned, the method steps b) to d) of the method according to the third aspect of the invention are preferably carried out only on coated portions of the spliced optical fiber in order to reduce mechanical stress on the uncoated section of the spliced optical fiber 2.

Step a) of the method of the invention is preferably carried out in such a way that a longitudinal axis of the spliced optical fiber 2 is substantially identical to a longitudinal axis of the protection tube 7. In other words, the PM fiber 3a, 3b is preferably centered inside the protection tube 7.

The spliced optical fiber according to the invention has a number of advantages; it provides good protection of the splice against mechanical stress and/or humidity. Particularly the reduction of PER variation due to the different measures of the invention results in a substantial increase in the fidelity of the light polarization state transmitted through the spliced optical fiber, which leads to a substantial increase in measurement accuracy in a FOCS application.

With regard to the method according to the invention, the first alternative is preferred due to its good compromise between sealing quality and simplicity and cost saving. The second alternative is more complex but may provide better protection at both ends of the tube. The third alternative provides the fastest and most inexpensive solution, at the cost of a lower sealing quality in terms of stress upon the spliced optical fiber.

While there are shown and described presently preferred embodiments of the invention, it is to be distinctly understood that the invention is not limited thereto but may otherwise variously be embodied and practised within the scope of the following claims. Therefore, terms like "preferred" or "in particular" or "particularly" or "advantageously", etc. signify optional and exemplary embodiments only.

REFERENCE LIST

1=fiber optic current sensor (FOCS)
2=spliced optical fiber
3=splice
3a=first polarization-maintaining (PM) fiber
3b=second polarization-maintaining (PM) fiber
4=current conductor
5=primary converter of FOCS
5a=optical fiber of primary converter
6=secondary converter of FOCS
7=protection tube
8a=uncoated section of spliced optical fiber 8b=coated section of spliced optical fiber
9=sealing
10=first outer dual-shrink sleeve
10a=outer tube of first outer dual-shrink sleeve
10b=inner tube of first outer dual-shrink sleeve
11a=first end of protection tube
11b=second end of protection tube
12=second outer dual-shrink sleeve
12a=outer tube of second outer dual-shrink sleeve
12b=inner tube of second outer dual-shrink sleeve
13=capillary sleeve
14=inner dual-shrink sleeve
14a=outer tube of inner dual-shrink sleeve
14b=inner tube of inner dual-shrink sleeve
C=electric current direction
L0=total length of protection tube
L1=distance from splice to first end of protection tube
L2=distance from splice to second end of protection tube

The invention claimed is:

1. A spliced optical fiber comprising a first and a second polarization-maintaining optical fiber connected to one another at one of their ends by splicing, thereby forming a splice at their connection point, and a protection tube arranged around the spliced optical fiber and surrounding at least an uncoated section of the spliced optical fiber which includes the splice, a first end and a second end of the protection tube sealed to the spliced optical fiber by a first and a second sealing arrangement for protecting the splice against mechanical stress and/or moisture,
the protection tube having such a length that an uncoated section of the spliced optical fiber comprising the splice and a coated section of the spliced optical fiber at each end of the uncoated section are arranged inside the protection tube,
a first distance from the first end of the protection tube and/or from the first sealing arrangement to a position of the splice and a second distance from the position of the splice to the second end of the protection tube and/or to the second sealing arrangement being greater than or equal to a predefined minimum distance $L_m$, the minimum distance $L_m$ satisfying the following equation:

$$4\sqrt{X_0 X_s} A(L_m) = X_m$$

$X_0$ being a maximum guaranteed polarization extinction ratio of the splice, $X_s$ being a maximum guaranteed polarization extinction ratio at the sealed ends of the protection tube, $A(L)$ being a coherence function of a length of the polarization-maintaining fiber and a Fourier transform of an optical power spectrum, and $X_m$ being a predetermined maximum allowable polarization extinction ratio variation.

2. The spliced optical fiber according to claim 1, wherein the protection tube is made of a material having a thermal expansion coefficient which is substantially equal to a thermal expansion coefficient of the first and the second polarization-maintaining optical fiber.

3. The spliced optical fiber according to claim 1, wherein the protection tube has a diameter in the range between 1 mm and 5 mm.

4. The spliced optical fiber according to claim 1, wherein at least one of the first and the second sealing arrangements comprises an outer dual-shrink sleeve adapted to shrink radially upon exposure to heat, thereby sealing the protection tube containing the section of the spliced optical fiber which includes the splice against humidity.

5. The spliced optical fiber according to claim 1, wherein a first outer dual-shrink sleeve of the first and sealing arrangement and/or a second outer dual-shrink sleeve of the second sealing arrangement each comprises an outer tube and an inner tube, wherein the first end and the second end of the protection tube are arranged between the inner tube and the outer tube of the respective first and second outer dual-shrink sleeves.

6. The spliced optical fiber according to claim 5, wherein at least one of the first and the second sealing arrangements comprises a capillary sleeve arranged partially inside the protection tube around a section of the spliced optical fiber, wherein the capillary sleeve is sealed to the spliced optical fiber by an inner dual-shrink sleeve at a first end facing the splice and is sealed by the inner tube of the respective outer dual-shrink sleeve at a second end.

7. The spliced optical fiber according to claim 6, wherein said first end of the capillary sleeve is arranged between an inner tube and an outer tube of the respective inner dual-shrink sleeve, wherein the capillary sleeve is chosen to be longer than the inner tube of the second outer dual-shrink sleeve in longitudinal direction.

8. The spliced optical fiber according to claim 7, wherein the outer tubes of at least one of the dual-shrink sleeves are made of a material able to radially shrink upon application of heat and the inner tubes are made of an adhesive material able to melt upon application of heat, wherein the materials of the inner tubes and outer tubes of dual-shrink sleeves have such properties that during a heat-up process by application of heat with a predefined temperature the inner tubes partially melt before the outer tubes begin to shrink.

9. The spliced optical fiber according to claim 8, wherein the spliced optical fiber is obtainable by a process comprising:
connecting a first and a second polarization-maintaining optical fiber at one of their ends by a splice, utilizing a splicing procedure that guarantees a maximum polarization extinction ratio of the splice of $X_0$;
arranging a protection tube around the spliced optical fiber such that the protection tube surrounds at least an uncoated section of the spliced optical fiber which includes the splice, wherein the protection tube has such a length that an uncoated section of the spliced optical fiber comprising the splice and a coated section of the spliced optical fiber at each end of the uncoated section are arranged inside the protection tube; and
sealing a first and a second end of the protection tube to the spliced optical fiber by a first and a second sealing arrangement, utilizing a sealing procedure that guarantees a maximum polarization extinction ratio of the spliced optical fiber at the first and/or the second sealing arrangement of $X_s$.

10. The spliced optical fiber according to claim 1, wherein the spliced optical fiber is comprised in an optical fiber communication device or in an optical measurement device.

11. The spliced optical fiber according to claim 1, wherein the spliced optical fiber is comprised in a fiber optic current sensor for measuring a current in a current-carrying conductor, the fiber optic current sensor comprising:
a primary converter suitable to be arranged around the conductor, wherein the primary converter is connected to the first polarization-maintaining optical fiber of the spliced optical fiber, and
a secondary converter comprising an opto-electronics unit and connected to the second polarization-maintaining optical fiber of the spliced optical fiber for generating light to propagate into the same and detecting light from it.

12. The spliced optical fiber according to claim 11, wherein the fiber optic current sensor is configured for measuring AC currents or DC currents up to 600 kA in one of a circuit breaker, a substation, or an aluminium production installation.

13. The spliced optical fiber according to claim 1, wherein the spliced optical fiber is formed by connecting two polarization-maintaining optical fibers, against mechanical stress and/or moisture, the splice of the spliced optical fiber protected by a process comprising:
   step a) positioning the spliced optical fiber into the protection tube, wherein the protection tube has such a length that the splice is located inside it at least at the predefined minimum distance from a first end and a second end of the protection tube;
   step b) sealing the first end of the protection tube around the spliced optical fiber by applying heat to a first outer dual-shrink sleeve arranged around a portion of the first end of the protection tube and a portion of the spliced optical fiber, thereby shrinking the first outer dual-shrink sleeve onto said portions; and subsequently
   step c) sealing a capillary sleeve around a portion of the spliced optical fiber in an area of the second end of the protection tube, wherein the capillary sleeve is positioned at least partially inside the protection tube, by applying heat to an inner dual-shrink sleeve arranged around a portion of that end of the capillary sleeve, which is nearest to the splice, and around a portion of the spliced optical fiber; and
   step d) sealing the second end of the protection tube around the spliced optical fiber by applying heat to a second outer dual-shrink sleeve arranged around a portion of a second end of the protection tube and a portion of the spliced optical fiber, thereby shrinking the second outer dual-shrink sleeve onto said portions;
   or:
   leaving out step b) and applying the sealing steps c) and d) at both the first end and the second end of the protection tube,
   or:
   leaving out steps b), c) and d) and instead injecting an adhesive material into the protection tube at both the first end and the second end of the protection tube.

14. The spliced optical fiber according to claim 13, wherein a preparation step a') is carried out before the process step a), comprising:
   a') attaching the first outer dual-shrink sleeve to the first end of the protection tube and the second outer dual-shrink sleeve to the second end of the protection tube by pre-heating the respective outer dual-shrink sleeve such that its free end remains open.

15. The spliced optical fiber according to claim 13, wherein a hydrophobic substance comprising a silane solution is applied onto an uncoated section of the spliced optical fiber, which comprises the splice, prior to the step a).

16. The spliced optical fiber according to claim 13, wherein the process steps a) to d) are carried out, or the adhesive is applied, only on coated portions of the spliced optical fiber.

17. The spliced optical fiber according to claim 13, wherein the step of sealing the second end of the protection tube around the spliced optical fiber is carried out after a predefined time interval upon completion of the sealing of the first end of the protection tube around the spliced optical fiber, wherein the predefined time interval equals at least a minimum cooling time of the respective outer dual-shrink sleeve or adhesive at the first end of the protection tube.

18. The spliced optical fiber of claim 1, wherein $X_0 \leq -25$ dB, $X_s \leq -30$ dB, and $X_m \leq 0.1\%$.

19. A method comprising:
   connecting a first end of a first polarization-maintaining optical fiber and a second end of a second polarization-maintaining optical fiber by a splice with a maximum polarization extinction ratio of $X_0$;
   arranging a protection tube around the spliced optical fiber such that the protection tube surrounds at least an uncoated section of the spliced optical fiber which includes the splice, the protection tube having such a length that an uncoated section of the spliced optical fiber comprising the splice and a coated section of the spliced optical fiber at each end of the uncoated section are arranged inside the protection tube; and
   sealing a first end of the protection tube to the spliced optical fiber by a first sealing arrangement and sealing a second end of the protection tube to the spliced optical fiber by a second sealing arrangement, such that:
   a maximum polarization extinction ratio of the spliced optical fiber at the first and/or the second sealing arrangement is $X_s$;
   the length of the protection tube is such that a first distance from the first end of the protection tube and/or from the first sealing arrangement to a position of the splice and a second distance from the position of the splice to the second end of the protection tube and/or to the second sealing arrangement are greater than or equal to a predefined minimum distance $L_m$ that satisfies the following equation:

$$4\sqrt{X_0 X_s} A(L_m) = X_m$$

$A(L)$ being a coherence function of a length of the polarization-maintaining fiber and a Fourier transform of an optical power spectrum, and $X_m$ being a predetermined maximum allowable polarization extinction ratio variation.

20. A spliced optical fiber comprising a first and a second polarization-maintaining optical fiber connected to one another at one of their ends by splicing, thereby forming a splice at their connection point, and a protection tube arranged around the spliced optical fiber and surrounding at least an uncoated section of the spliced optical fiber which includes the splice, a first end and a second end of the protection tube sealed to the spliced optical fiber by a first and a second sealing arrangement for protecting the splice against mechanical stress and/or moisture,
   the protection tube having such a length that an uncoated section of the spliced optical fiber comprising the splice and a coated section of the spliced optical fiber at each end of the uncoated section are arranged inside the protection tube,
   a first outer dual-shrink sleeve of the first and sealing arrangement and/or a second outer dual-shrink sleeve of the second sealing arrangement each comprising an outer tube and an inner tube, the first end and the second end of the protection tube arranged between the inner tube and the outer tube of the respective first and second outer dual-shrink sleeves,
   at least one of the first and the second sealing arrangements comprising a capillary sleeve arranged partially inside the protection tube around a section of the spliced optical fiber, the capillary sleeve being sealed to the spliced optical fiber by an inner dual-shrink sleeve at a first end facing the splice and is sealed by the inner tube of the respective outer dual-shrink sleeve at a second end, and said first end of the capillary sleeve being arranged between an inner tube and an outer tube of the respective inner dual-shrink sleeve, wherein the capillary sleeve is chosen to be longer than the inner tube of the second outer dual-shrink sleeve in longitudinal direction.

* * * * *